United States Patent
Kübel et al.

(10) Patent No.: US 12,408,259 B2
(45) Date of Patent: Sep. 2, 2025

(54) DEVICE FOR EMITTING LIGHT

(71) Applicants: Johann Kübel, Kasten (AT); Gerald Zinner, Kasten (AT)

(72) Inventors: Johann Kübel, Kasten (AT); Gerald Zinner, Kasten (AT)

(*) Notice: Subject to any disclaimer, the term of this patent is extended or adjusted under 35 U.S.C. 154(b) by 782 days.

(21) Appl. No.: 17/295,246

(22) PCT Filed: Dec. 10, 2019

(86) PCT No.: PCT/AT2019/060432
§ 371 (c)(1),
(2) Date: May 19, 2021

(87) PCT Pub. No.: WO2020/118339
PCT Pub. Date: Jun. 18, 2020

(65) Prior Publication Data
US 2021/0400799 A1 Dec. 23, 2021

(30) Foreign Application Priority Data
Dec. 13, 2018 (AT) ................................. A51104/2018

(51) Int. Cl.
*H05K 1/02* (2006.01)
*B05D 3/06* (2006.01)
*B29C 35/08* (2006.01)

(52) U.S. Cl.
CPC ........... *H05K 1/0204* (2013.01); *B05D 3/067* (2013.01); *B29C 35/0805* (2013.01); *B29C 2035/0827* (2013.01); *H05K 2201/10106* (2013.01)

(58) Field of Classification Search
None
See application file for complete search history.

(56) References Cited

U.S. PATENT DOCUMENTS

| 5,215,859 A | * | 6/1993 | Martens | ................ | G03F 7/2024 |
| | | | | | 430/254 |
| 5,304,453 A | * | 4/1994 | Lin | ........................... | G03F 7/40 |
| | | | | | 430/326 |
| 5,585,450 A | * | 12/1996 | Oaks | ...................... | C07F 7/0838 |
| | | | | | 526/284 |

(Continued)

FOREIGN PATENT DOCUMENTS

| DE | 10-2008-031262 A1 | 1/2010 | |
| WO | WO-2020125839 A1 * | 6/2020 | ............. G06F 21/31 |

*Primary Examiner* — Srinivas Sathiraju
(74) *Attorney, Agent, or Firm* — Maschoff Brennan

(57) ABSTRACT

A device for emitting UV light to cure substances that cure when irradiated by light includes an electrical illumination body having at least one thermal contact area and at least two electrical connections. The thermal energy that arises in the context of the emission of light can be dissipated via the thermal contact area. The illumination body is applied to a carrier element. The carrier element has at least one cutout in the region of the thermal contact area of the illumination body. A heat sink is thermally conductively connected to the thermal contact area of the illumination body in the region of the cutout in the carrier element. An NTC thermistor is electrically conductively connected to the electrical connections of the illumination body. The NTC thermistor is thermally conductively connected to the heat sink and at the same time electrically insulated from the heat sink.

18 Claims, 1 Drawing Sheet

(56) References Cited

U.S. PATENT DOCUMENTS

| | | | | |
|---|---|---|---|---|
| 5,774,150 | A * | 6/1998 | Kobayashi | B41J 2/1604 347/63 |
| 7,615,488 | B2 * | 11/2009 | Maekawa | H10D 30/6746 438/149 |
| 7,709,843 | B2 * | 5/2010 | Yamazaki | H10D 30/0314 257/E29.151 |
| 8,382,333 | B2 * | 2/2013 | Chen | H05K 3/3457 362/249.02 |
| 8,389,862 | B2 * | 3/2013 | Arora | H05K 1/00 174/254 |
| 9,012,784 | B2 * | 4/2015 | Arora | H05K 3/326 174/254 |
| 10,342,119 | B1 * | 7/2019 | Mujcinovic | H05K 7/20436 |
| 10,980,105 | B2 * | 4/2021 | Feichtinger | H10H 20/8585 |
| 2005/0196710 | A1 * | 9/2005 | Shiroguchi | H10D 86/0241 430/324 |
| 2005/0221203 | A1 * | 10/2005 | Fujii | H10D 30/0321 257/E21.414 |
| 2005/0263765 | A1 * | 12/2005 | Maekawa | H10D 86/0241 257/69 |
| 2007/0051958 | A1 * | 3/2007 | Yamazaki | H10D 30/0314 257/E21.414 |
| 2008/0032491 | A1 * | 2/2008 | Herchen | H01L 21/2686 257/E21.349 |
| 2008/0105875 | A1 * | 5/2008 | Maekawa | H10D 30/6732 257/E21.414 |
| 2008/0174969 | A1 * | 7/2008 | Sandwall | H05K 1/0204 29/829 |
| 2011/0211351 | A1 * | 9/2011 | Van De Ven | F21V 29/74 362/249.02 |
| 2011/0261536 | A1 | 10/2011 | Feichtinger et al. | |
| 2012/0307505 | A1 * | 12/2012 | Chen | F21V 29/70 362/382 |
| 2018/0070436 | A1 * | 3/2018 | Feichtinger | H05K 1/185 |
| 2019/0090381 | A1 * | 3/2019 | Durgin | H01L 23/36 |
| 2019/0110366 | A1 * | 4/2019 | Gavagnin | H05K 1/16 |
| 2021/0400799 | A1 * | 12/2021 | Kübel | H05K 1/0204 |
| 2022/0055290 | A1 * | 2/2022 | Hahn | B29C 64/282 |

* cited by examiner

DEVICE FOR EMITTING LIGHT

BACKGROUND OF THE INVENTION

Field of the Invention

The invention relates to a device and an arrangement for emitting light, in particular for hardening substances which harden under irradiation of light, in particular UV light.

Description of Related Art

It is known from the state of the art that high-energy radiation can be used to rapidly cure liquid coating materials such as adhesives, lacquers or paints. The radiation sources for this are usually special illumination bodies that emit UV light, especially UV-A light. Common UV lamps of this kind are, for example, mercury vapour lamps. UV light-emitting diodes are also available for such applications. The advantages of these diodes are that they are mercury-free and particularly small, so that they only require a small space. However, if such light-emitting diodes are operated over a longer period of time, they can heat up considerably, resulting in overheating and damage to the light-emitting diodes.

BRIEF SUMMARY OF THE INVENTION

It is therefore the object of the invention to provide a device for emitting light which ensures light emission from a lighting fixture over a longer period of time without the risk of overheating the lighting fixture.

The invention solves this problem by means of a device for emitting light, in particular for the hardening of substances which harden under the irradiation of light, in particular UV light, having the features of the patent claim 1. According to the invention, the following are provided:
- an electrical light fixture with at least one heat contact surface and at least two electrical connections,
    - whereby heat energy generated during the light emission can be dissipated over the heat contact surface,
    - wherein the light fixture is mounted on a support element,
    - wherein the support element has at least one recess in the area of the heat contact surface of the light fixture,
- a heat sink which is heat conductively connected to the heat contact surface of the light fixture in the area of the recess in the support element, and
- a thermistor which is electrically conductively connected to the electrical connections of the light fixture, the thermistor being heat conductively connected to the heat sink and at the same time being electrically insulated from the heat sink.

An overheating of the light fixture can be advantageously avoided with such a light emitting device, since heat energy generated during the emission of light is transferred from the light fixture to the heat sink via the heat contact surface.

A particularly energy-saving design of the light emitting device can be ensured if the light fixture comprises a light-emitting diode which is designed to emit UV light, in particular UV-A light, preferably in a wavelength range of 315 to 380 nm. The use of a light-emitting diode as a light fixture is advantageous not only because of its comparatively low power consumption, but also because the light-emitting diodes have a comparatively long service life and are characterised by a particularly small and compact design.

A particularly compact and stable design can be achieved in a light emitting device according to the invention if the support element is designed as a printed circuit board.

In order to ensure a simple connection of the contacts of the heat conductor with the electrical contacts of the light fixture, it can be provided that the support element has at least two passages, whereby the two contacts, in particular the contact pins of the heat conductor, are guided through the passages to the electrical connections of the light fixture, in particular contact pins of the thermistor are guided through the passages to the electrical connections of the light fixture.

In order to ensure that the heat energy generated in the light fixture is dissipated as quickly as possible, it can be provided that the heat sink is made of copper or a copper alloy.

The effortless installation of a light emitting device according to the invention as a component in, for example, industrial robots can be ensured if the heat sink has at least one connection point in order to form a cohesive bond, in particular by brazing or gluing, in its area facing away from the thermistor.

A particularly efficient dissipation of the heat energy generated at the light fixture is ensured if the connection between the thermistor and the heat sink is made by means of a thermally conductive and electrically insulating bonding agent, in particular an adhesive, preferably a high-temperature resistant, heat conductive adhesive.

In order to ensure a particularly efficient heat transfer from the heat contact surface of the light fixture to the heat sink, it can be provided that the heat sink has a projection, the shape and height of the projection being adapted to the shape and height of the recess in the support element, so that the projection is guided through the recess to the heat contact surface of the light fixture and is in flat contact with the heat contact surface. This design of the heat sink is particularly advantageous, for example, when high-power light-emitting diodes are used as light fixture, as these have a higher heat energy output than conventional light-emitting diodes. The invention further refers to an arrangement for emitting light, in particular for the hardening of substances which harden under the irradiation of light, in particular UV light. According to the invention, there are provided a multitude of light emitting devices according to the invention, a power source for supplying the devices with power, and a driver connected downstream from the power source, wherein the devices are connected in series and connected to the driver, and wherein the driver is designed to adjust a constant power flow through the devices.

With an arrangement according to the invention, a particularly rapid curing of, for example, UV-curing adhesives can be achieved even on large surfaces, since the performance of the arrangement can be multiplied in comparison to the performance of a single device by the joint connection of a number of devices.

Further advantages and embodiments of the invention will be apparent from the description and the accompanying drawings.

The invention is illustrated schematically below by means of particularly advantageous, but not restrictive, examples of embodiments in the drawings and is described by way of example with reference to the drawings.

BRIEF DESCRIPTION OF THE SEVERAL VIEWS OF THE DRAWINGS

Hereafter there are Shown Schematically.

DETAILED DESCRIPTION OF THE INVENTION

Figure 1:
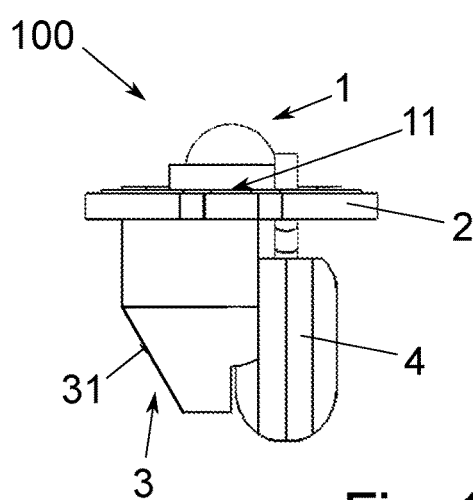
FIG. 1 a side view of an example of a light emitting device according to the invention, FIG. 2 a second side view of the device from FIG. 1, F FIG. 3 a top view of the device from FIG. 1, FIG. 4 an exploded view of the device from FIG. 1 and FIG. 5 a diagonal view of the device from FIG. 1.
Figure 2:
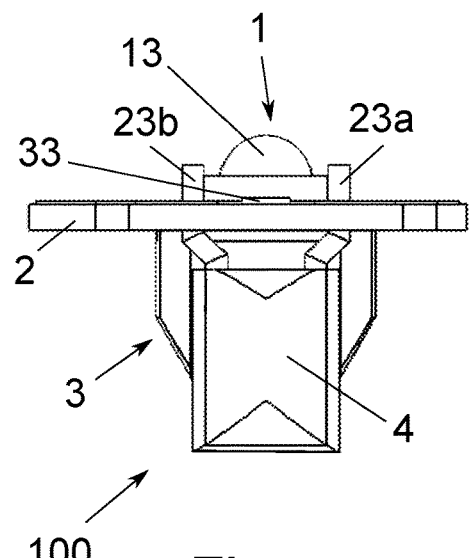

FIGS. 1 to 5 show an example of a light-emitting device 100 according to the invention. In the example shown, the device 100 comprises an electric light fixture 1 with a heat contact surface 11 and two electrical connections 12a, 12b. The light fixture 1 is arranged on a support element 2 and the heat contact surface 11 is used to dissipate the heat energy generated by the light emission from the light fixture 1. For this purpose, the support element 2 has a recess 21 in the area of the heat contact surface 11 of the light fixture 1.

The recess 21 has an elongated shape in the example shown, but can alternatively also have a round shape, for example. Furthermore, instead of one recess 21, there can also be a multitude of recesses 21, which are disposed e.g., one behind the other in the area of the heat contact surface 11.

In the example shown, the device 100 further comprises a heat sink 3 which is connected in a heat-conductive manner to the heat contact surface 11 of the light fixture 1 in the region of the recess 21 in the support element 2. Thus, the heat energy generated in the light fixture 1 is transmitted to the heat sink 3 via the contact surface 11.

The device 100 further comprises a thermistor 4, which is electrically conductively connected to the electrical connections 12a, 12b of the light fixture. The thermistor 4 is connected to the heat sink 3 in a thermally conductive manner and at the same time electrically insulated in relation to the heat sink 3.

Such a light emitting device 100 can be used, for example, to cure substances that harden under the irradiation of light such as UV light. In the example shown, it is particularly advantageous in this context that the device 100 comprises a light-emitting diode 13 as the light fixture 1. In this way, the device 100 can be designed to be particularly small and compact, so that it not only does not require mercury in comparison with previously known mercury vapour lamps, which are used for the hardening of substances, but also has a significantly smaller space requirement and can thus be easily installed as a component, e.g., in robots.

In the example shown, the light fixture 1 or the light-emitting diode 13 is specifically a UV light-emitting diode designed to emit UV-A light in a wavelength range of 315 to 380 nm. In the example shown, the semi-conductor crystal of the light-emitting diode 13 is applied to a square substrate which has an edge length of a few millimetres, for example 3 mm, as shown in FIG. 3 to FIG. 5.

Figure 3:
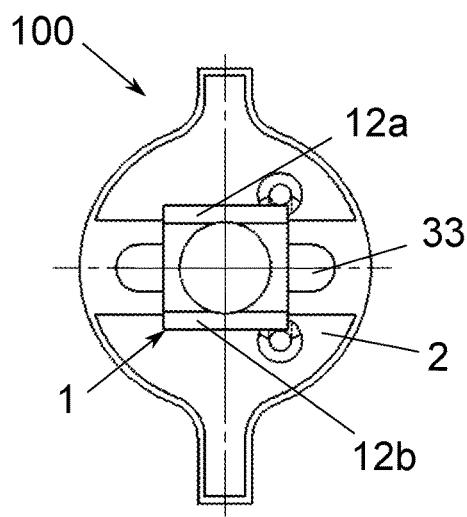
Figure 4:
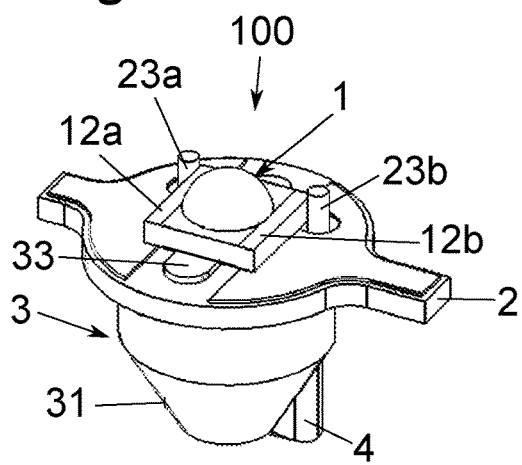

This light fixture 1 is arranged on a support element 2, which is designed as a printed circuit board and has a longitudinal recess 21 in the area of the heat contact surface 11 of the light fixture 1, which is located on the lower part of the substrate, as shown in FIG. 3.

Figure 5:
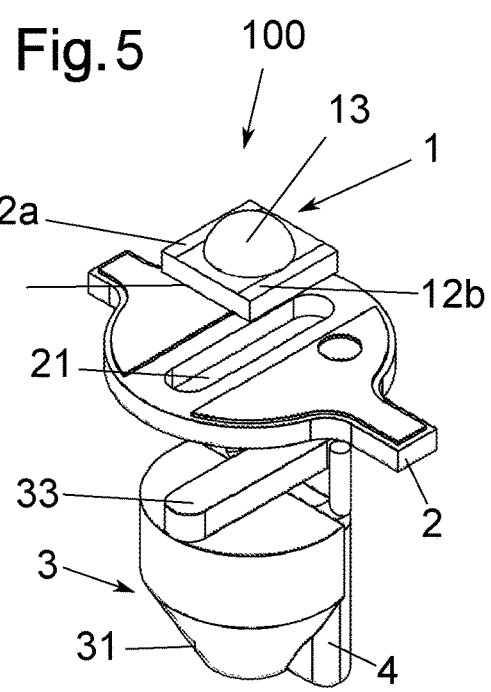

The electrical connections 12a, 12b of the electrical light fixture 1 are disposed laterally on the substrate of the light emitting diode 13 in the illustrated embodiment, and the support element 2 advantageously has two passages through which the contacts (e.g., contact pins 23a, 23b) of the thermistor 4 are guided to the electrical connections 12a, 12b of the light fixture 1 (see FIG. 3, FIG. 5). In the example shown, the thermistor 4 has two contact pins 23a, 23b which pass through the round passages in the support element 2 and are guided to the electrical connections 12a, 12b (see FIG. 2, FIG. 5).

Alternatively, depending on the area of application, in a device 100 according to the invention the light fixture 1 may also comprise a different lamp or a differently designed light emitting diode 13, which has a different structure or is designed to emit light in a different wavelength range.

In the example shown, the heat sink 3 is made of copper, as copper has a high heat conductivity. Alternatively, in all embodiments of a device 100 according to the invention, the heat sink can be made of a copper alloy or other materials with high heat conductivity.

The heat sink 3 has a projection 33 at which the heat sink 3 is in flat contact with the heat contact surface 11 of the light fixture 1. As shown in FIG. 4, the shape and height of the projection 33 is adapted to the shape and height of the recess 21 in the support element 2 in such a way that it projects through the support element 2 and is guided to the heat contact surface of the light fixture 1.

In the example shown, the shape of the heat sink 3 is composed of a half-cylinder and a half-truncated cone, whereby the heat sink 3 has a connection point 31 in order to form a cohesive connection. The connection point 31 is located in the area of the heat sink 3 facing away from the thermistor 4, so that a device 100 according to the invention can be easily incorporated into larger installations or devices, for example by brazing or gluing.

As already mentioned, the thermistor 4 is connected to the heat sink 3 in a heat-conducting manner and at the same time is electrically insulated with respect to the heat sink 3. In the example shown, this is achieved by establishing the connection between the thermistor 4 and the heat sink 3 by means of a heat-conducting and electrically insulating bonding agent. In the example shown, the bonding agent is a resin such as a synthetic resin, which is mixed with ceramic or mineral fillers, so that heat is conducted over the bonding agent, but no electrical power can flow. Such adhesives have the additional advantage that they have a high temperature stability of, for example, up to 200° C.

If during operation of the device 100 the electrical connections 12a, 12b of the light fixture 1 are passed by power, this generates UV light in a selected wavelength range, whereby heat energy is also generated. Since high temperatures can drastically shorten the service life of the light-emitting diodes 13 and can also lead to UV light no longer being emitted in the desired wavelength range, the thermistor 4 contacts the electrical connections 12a, 12b of the light fixture 1. In the cold state, the resistance of the thermistor 3 is comparatively high, but as the temperature rises, it decreases further in accordance with a characteristic curve for the relevant thermistor 4.

If the light fixture 1 generates heat energy during operation, this is transferred to the heat sink 3 via the heat contact surface 11. The contact on the heat contact surface 11 with the heat sink 3 is made, for example, by brazing. The heat sink 3 is thermally connected to the thermistor 4 so that the temperature of the thermistor 4 increases when the heat energy is generated by the light fixture 1 and conducted to the heat sink 3. In this way, the resistance or the electrical conductivity of the thermistor 4 decreases or increases according to the characteristic curve of the thermistor 4.

Particularly advantageous for illuminating large areas—in particular UV light—for hardening of substances that harden under radiation, is an arrangement according to the invention for emitting light comprising a multitude of devices 100, a power source for supplying the devices 100 with power and a driver connected downstream from the power source. In this way it is possible, for example, to connect up to 15 devices 100 in series, these being connected to the driver. The driver ensures a constant power flow through the devices 100. The intensity of the illumination can be increased accordingly with such an arrangement, so that a faster hardening is ensured. In addition, larger surface areas can also be illuminated in this way.

The invention claimed is:

1. A light-emitting device for the hardening of substances which harden under the irradiation of light, comprising:
   an electrical light fixture with at least one heat contact surface and at least two electrical connections, whereby heat energy generated during the light emission can be dissipated over the heat contact surface, wherein:
   the electrical light fixture is mounted on a support element, and
   the support element has at least one recess in the area of the heat contact surface of the electrical light fixture,
   a heat sink which is heat conductively connected to the heat contact surface of the electrical light fixture in the area of the recess in the support element, and
   a thermistor which is electrically conductively connected to the electrical connections of the electrical light fixture, the thermistor being heat conductively connected to the heat sink and at the same time being electrically insulated from the heat sink,
   wherein the support element has at least two passages and wherein contact pins of the thermistor are guided through the passages to the electrical connections of the electrical light fixture, and
   wherein the electrical light fixture comprises a light emitting diode which is designed to emit UV-A light in a wavelength range of 315 to 380 nm.

2. The light-emitting device according to claim 1, wherein the support element is designed as a printed circuit board.

3. The light-emitting device according to claim 2, wherein the support element has at least two passages, two contacts, in particular contact pins of the thermistor being guided through the passages to the electrical connections of the electrical light fixture.

4. The light-emitting device according to claim 3, wherein the heat sink is made of copper or a copper alloy.

5. The light-emitting device according to claim 4, wherein the heat sink has at least one connection point in order to form a cohesive bond, by brazing or gluing, in its region facing away from the thermistor.

6. The light-emitting device according to claim 1, wherein the support element is designed as a printed circuit board.

7. The light-emitting device according to claim 1, wherein the heat sink is made of copper or a copper alloy.

8. The light-emitting device according to claim 1, wherein the heat sink has at least one connection point in order to form a cohesive bond, by brazing or gluing, in its region facing away from the thermistor.

9. The light-emitting device according to claim 1, wherein the connection between the thermistor and the heat sink is made by means of a heat-conducting and electrically insulating bonding agent.

10. The light-emitting device according to claim 1, wherein the heat sink has a projection adapted in its shape and height to the shape and height of the recess in the support element, so that the projection is guided through the recess to the heat contact surface of the electrical light fixture and is in flat contact with the heat contact surface.

11. An arrangement for emitting light for hardening substances which harden under irradiation of light comprising: a plurality of light emitting devices according to claim 1, a power source for supplying the devices with power, and a driver connected downstream from the power source, wherein: the devices are connected in series and connected to the driver, and the driver is designed to adjust a constant power flow through the devices.

12. The arrangement for emitting light according to claim 11, wherein the support element is designed as a printed circuit board.

13. The arrangement for emitting light according to claim 11, wherein the support element has at least two passages, the two contacts, in particular contact pins of the thermistor being guided through the passages to the electrical connections of the electrical light fixture.

14. The arrangement for emitting light according to claim 11, wherein the heat sink is made of copper or a copper alloy.

15. The arrangement for emitting light according to claim 11, wherein the heat sink has at least one connection point in order to form a cohesive bond, by brazing or gluing, in its region facing away from the thermistor.

16. The light-emitting device according to claim 1, wherein the heat-conducting and electrically insulating bonding agent comprises a high-temperature resistant, heat-conductive adhesive.

17. The arrangement for emitting light according to claim 1, wherein the thermistor and the heat sink are located on an opposite side of the support element from the electrical light fixture.

18. A light-emitting device for the hardening of substances which harden under the irradiation of light, comprising:
   a light-emitting diode with at least one heat contact surface and at least two electrical connections, whereby heat energy generated during light emission can be dissipated over the heat contact surface, wherein: the light-emitting diode is mounted on a first side of a support element, and the support element has at least one recess in an area of the heat contact surface of the light-emitting diode,
   a heat sink primarily positioned on a second side of the support element opposite the first side, wherein the heat sink is heat conductively connected to the heat contact surface of the light-emitting diode through the recess in the support element, and
   a thermistor positioned on the second side of the support element and which is electrically conductively connected to the electrical connections of the light-emitting diode, the thermistor being heat conductively connected to the heat sink and electrically insulated from the heat sink,
   wherein the support element has at least two passages and wherein contact pins of the thermistor are guided through the passages to the electrical connections of the electrical light fixture, and
   wherein the light-emitting diode is designed to emit UV-A light in a wavelength range of 315 to 380 nm.

* * * * *